(12) United States Patent
Liu et al.

(10) Patent No.: US 8,906,599 B2
(45) Date of Patent: Dec. 9, 2014

(54) ENHANCED SCANNER THROUGHPUT SYSTEM AND METHOD

(75) Inventors: Yu-Mei Liu, Hsinchu (TW); Chin-Hsiang Lin, Hsin-chu (TW); Heng-Hsin Liu, New Taipei (TW); Heng-Jen Lee, Baoshan Township, Hsinchu County (TW); I-Hsiung Huang, Hsinchu County (TW); Chih-Wei Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 72 days.

(21) Appl. No.: 13/473,695

(22) Filed: May 17, 2012

(65) Prior Publication Data

US 2013/0309612 A1 Nov. 21, 2013

(51) Int. Cl.
*G03F 7/20* (2006.01)
(52) U.S. Cl.
USPC .......................................................... 430/322
(58) Field of Classification Search
USPC .................................................. 430/322, 394
See application file for complete search history.

(56) References Cited

U.S. PATENT DOCUMENTS

| | | | |
|---|---|---|---|
| 2005/0112474 A1* | 5/2005 | Sandstrom | 430/5 |
| 2005/0248741 A1* | 11/2005 | Kawamura et al. | 355/53 |
| 2007/0285639 A1* | 12/2007 | Liang et al. | 355/53 |
| 2010/0033698 A1* | 2/2010 | Sewell | 355/53 |

OTHER PUBLICATIONS

Office Action dated Apr. 29, 2014, from related Korean Patent Application No. 10-2012-132979, 13 total pages.

* cited by examiner

*Primary Examiner* — Brittany Raymond
(74) *Attorney, Agent, or Firm* — Duane Morris LLP

(57) ABSTRACT

A method and system to improve scanner throughput is provided. An image from a reticle is projected onto a substrate using a continuous linear scanning procedure in which an entire column of die or cells of die is scanned continuously, i.e. without stepping to a different location. Each scan includes translating a substrate with respect to a fixed beam. While the substrate is translated, the reticle is also translated. When a first die or cell of die is projected onto the substrate, the reticle translates along a direction opposite the scan direction and as the scan continues along the same direction, the reticle then translates in the opposite direction of the substrate thereby forming an inverted pattern on the next die or cell. The time associated with exposing the substrate is minimized as the stepping operation only occurs after a complete column of cells is scanned.

13 Claims, 3 Drawing Sheets

US 8,906,599 B2

ENHANCED SCANNER THROUGHPUT SYSTEM AND METHOD

TECHNICAL FIELD

The disclosure relates to semiconductor device manufacturing systems and methods and, more particularly, to patterning systems and methods.

BACKGROUND

Scanners are photolithography tools used to form patterns on substrates such as semiconductor substrates, i.e. wafers. Scanners are considered a type of stepper and are used to create millions of microscopic circuit elements on the substrate surface. A die or chip typically includes millions of these microscopic circuit elements that combine to form an integrated circuit or other semiconductor device. Each substrate includes hundreds or even thousands of individual die.

The microscopic circuit elements that combine to form an integrated circuit or other semiconductor device, are produced in a pattern of transparent and opaque areas on the surface of a quartz plate called a reticle. The scanner passes light through the reticle, projecting an image of the reticle pattern onto the substrate. The image is focused and reduced by a lens and projected onto the surface of the substrate that is coated with a photosensitive material called photoresist. The reticle may include one die or chip, or it may include a cell of multiple die, as its exposure field. The multiple die that combine to form the cell that appears on the reticle, may be the same die or the die may differ from one another. In steppers, the image of the reticle is projected onto the substrate during the exposure operation which includes exposing the entire exposure field during each exposure "shot". The exposure field may include an individual die or cell of multiple die, as above. A scanner does not expose the entire field at once but rather exposes the substrate through an exposure slit that is generally at least as wide as the exposure field, but only a fraction of its length. The stage holding the substrate is translated relative to the fixed exposure slit so that the entire exposure is projected from the reticle onto the substrate as the beam scans across the die and the substrate. Subsequent manufacturing operations such as developing, form a photomask out of the photoresist material after the image from the exposure field of the reticle has been projected onto the photoresist. The photomask is used in subsequent processing operations.

A substrate typically includes the individual die or chips arranged in columns and rows. The operation of patterning an entire substrate to produce hundreds or thousands of die that are arranged in the rows and columns, is a time-consuming operation. This time-consuming operation must be carried out at multiple device levels in the sequence of fabrication operations used to form an integrated circuit or other semiconductor device.

It would therefore be advantageous to reduce the time required to expose an entire substrate using a scanner.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a method for forming a pattern on a substrate using a scanner. The method includes providing a semiconductor substrate that is substantially circular in shape. The substrate is divided into a plurality of individual die arranged in columns and rows. The scanner includes an illumination source and a projection lens. A beam is projected from the illumination source through an exposure slit and projects the image from a reticle onto the substrate starting at a first location at or near an edge of the substrate. The pattern is projected from the reticle onto the entire substrate by scanning. Each scan is a continuous linear scan along a complete one of the columns in one embodiment.

The reticle includes an individual die in one embodiment, and in another embodiment, the reticle includes a cell that includes multiple die. The multiple die may include an array or other arrangement of a plurality of the same die and in another embodiment, the cell includes different types of die such as active die and test chips.

In the manufacture of a semiconductor device, patterns are formed at multiple device levels and the disclosed system and method is applicable to patterning operations at each of the device levels used in the manufacture of a semiconductor device. The semiconductor device is an integrated circuit in one embodiment. In other embodiments, the die represent different types of semiconductor devices.

The image from the reticle, i.e. the individual die or cell of multiple die, is projected onto a substrate in which the die or cells are arranged in a plurality of columns and rows. The columns and rows are divided into individual die and a pattern is formed on each die, or on each portion of a new substrate designated as a die. The exposure field of the reticle, e. g. the die or cell, is projected onto the associated die or cell as the beam scans across the translating substrate. As the beam scans across the translating substrate, the pattern of the exposure field, i.e. cell or die, of the reticle is repeatedly projected onto the substrate to form multiple die.

Figure 1:
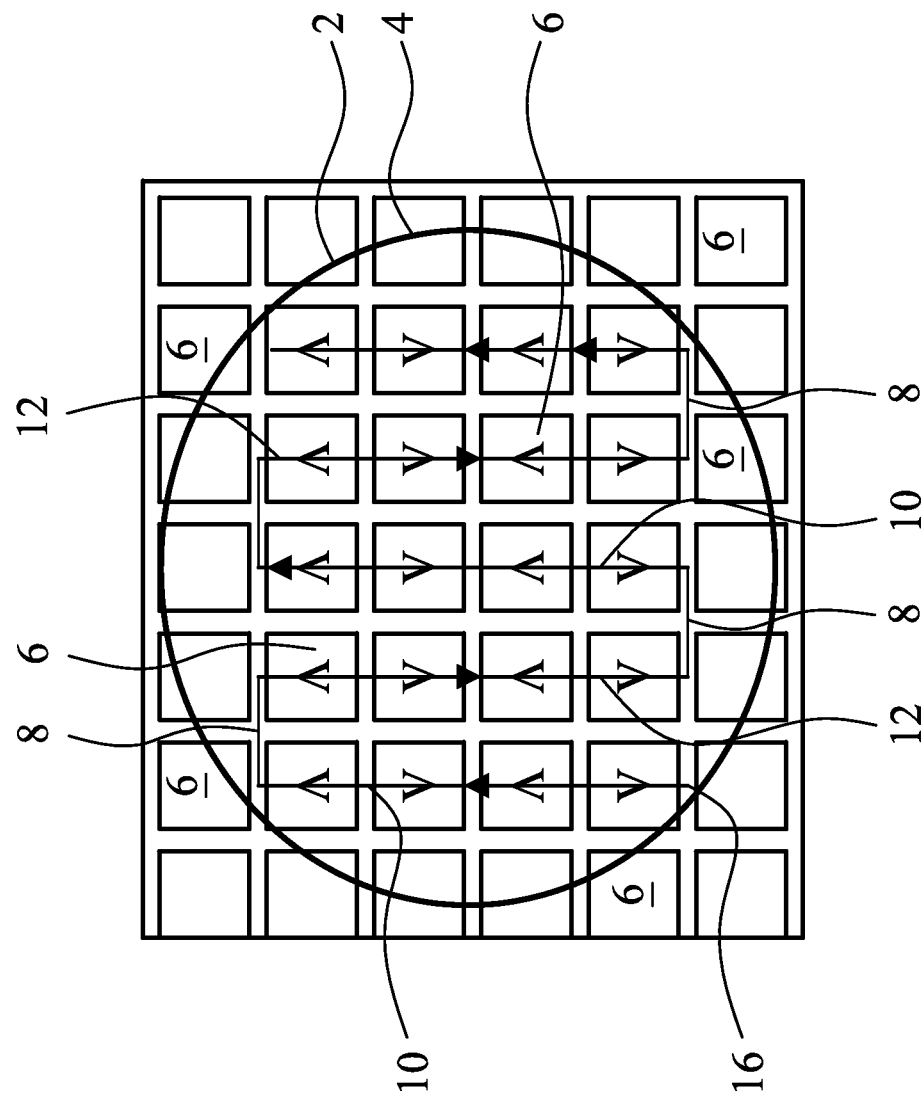
FIG. 1 is a plan view showing a column by column scanning operation used to expose cells arranged in columns and rows on the substrate.

FIG. 1 shows substrate 2, which is a semiconductor wafer in one embodiment. Substrate 2 is formed of various materials in various embodiments and is generally round in shape. Substrate 2 includes various dimensions in various embodiments. Some common substrate sizes used in semiconductor manufacturing include 8 inch diameter, 12 inch diameter, and 18 inch diameter substrates but other dimensions are used in other embodiments. Substrate 2 undergoes patterning in a scanner apparatus that is configured to accommodate and handle the appropriately sized substrate. Substrate 2 is defined by edge 4. The grid in the background of FIG. 1 shows how substrate 2 is divided into a number of cells 6. In one embodiment, cell 6 is an individual die and in another embodiment, cell 6 represents a plurality of die. Cell 6 represents a unit on substrate 2 onto which the image of the exposure field of the reticle is projected. In the illustrated embodiment, some of cells 6 overhang substrate 2. In some embodiments, the patterned portion of substrate 2 is truncated because the cells 6 that are not completely within substrate 2 are not patterned. This embodiment is shown in FIG. 1. In other embodiments, patterns are formed in partial cells 6 that extend partially over edge 4. This embodiment is shown in FIG. 2 and is generally the case when cells 6 include multiple individual die, some of which are completely formed on substrate 2 even when other portions of cell 6 extend past edge 4.

Substrate 2 is patterned in a scanner by first forming a photoresist film on substrate 2 and then exposing a pattern onto each of the cells 6 of substrate 2 by scanning. A beam from an illumination source passes through an exposure slit, the reticle and a projection lens, projecting the image from the exposure field of the reticle, onto substrate 2, for each cell 6. The beam is a collimated beam in some embodiments. Instead of exposing the entire exposure field of the reticle, i.e. cell 6, at the same time, the exposure is made through the exposure slit that is as wide as the exposure field but only a fraction of its length in some embodiments. The beam passes through the exposure slit and the pattern on the reticle is scanned onto the substrate as the substrate is translated with respect to the light beam. This will be shown in FIG. 3.

FIG. 1 shows multiple scans of the substrate relative to the beam that is fixed by the fixed exposure slit. Scan 10 represents substrate 2 being translated with respect to the fixed beam such that the beam and image are scanned along the direction as indicated by the arrowheads on scan 10. Scan 10 is a continuous linear scan along an entire column of cells 6 and scan 12 is a continuous linear scan along the entire column of cells 6. Scan 10 and scan 12 take place in opposite scan directions. Step 8 represents substrate 2 being moved with respect to the fixed beam while exposure does not take place. The scan speed along scan 10 is substantially constant after a brief ramp up. In some embodiments, a brief slowdown period at the end of the scan is also used in some embodiments. The ramp up and any slowdown times are negligible relative to the scan which continues along an entire column which may be 10-18 inches in some embodiments so the scan speed is essentially constant. The time required to pattern an entire substrate is reduced because of the high ratio between scans 10, 12 during which patterning takes place, and step 8 during which patterning does not take place. Scans 10 and 12 extend in opposite directions in adjacent columns. The "V's" that appear in each cell 6 indicate the relative orientation of the pattern formed in the respective cell 6, as will be demonstrated more clearly in FIG. 3. Adjacent cells along the scan direction have inverse patterns. The exposure of the pattern onto substrate 2 begins at starting point 16 which is substantially on edge 4 of substrate 2. Starting point 16 is in close proximity and adjacent edge 4 in other embodiments and represents the outermost corner of a die in closest proximity to edge 4. In the embodiment illustrated in FIG. 1, the scan, i.e. scans 10, 12 involve a continuous scan along a complete column of cells 6.

Figure 2:
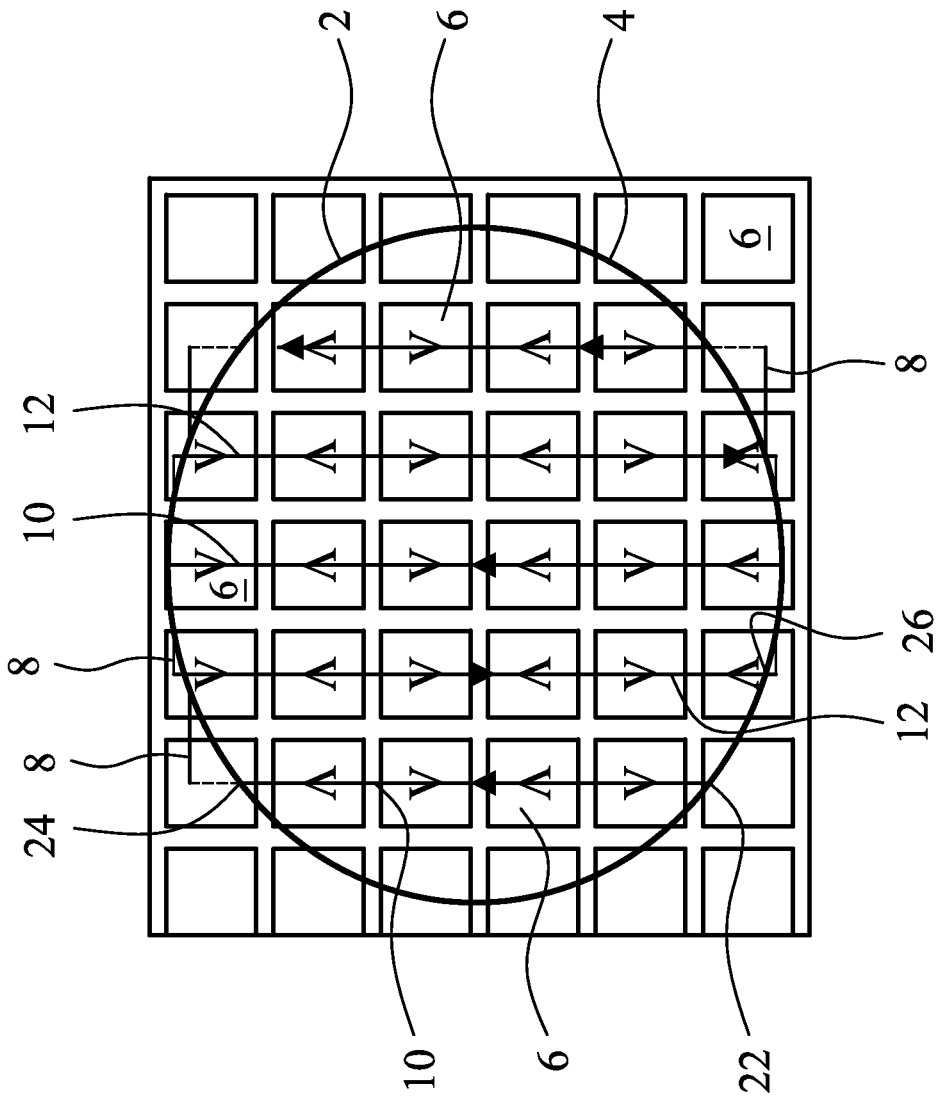
FIG. 2 is a plan view showing another embodiment of a column by column scanning operation used to expose cells arranged in columns and rows on the substrate.

FIG. 2 is substantially similar to FIG. 1 and illustrates another embodiment in which each scan 10, 12 begins at a location along edge 4 of substrate 2 and continues in a linear direction until the beam intersects edge 4 at a second location. In this embodiment, partial cells 6 are patterned on the substrate and steps 8, which represent the position of substrate 2 aligned with the exposure slits when exposure is not taking place, extend out of the bounds of substrate 2.

Figure 3:
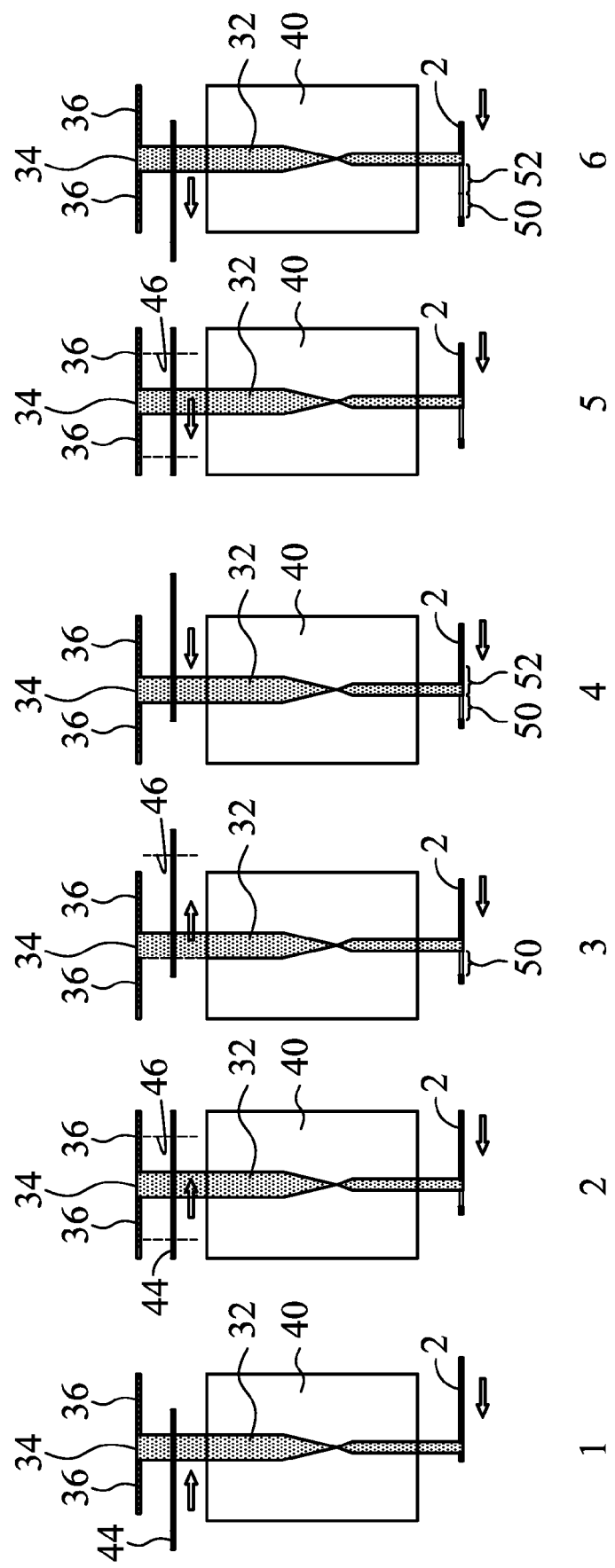
FIG. 3 is a side view showing six exemplary steps of a scanning operation according to the disclosure.

During each of the scans, both the substrate (substrate 2) and reticle move with respect to the beam formed by the light that extends through the exposure slit as shown in FIG. 3.

FIG. 3 shows six successive steps in an exposure operation used to expose, i.e. project a pattern onto, two adjacent cells along a continuous linear scan. Beam 32 formed by light from an illumination source that passes through a fixed exposure slit defined by opening 34 formed between opaque members 36. Various illumination sources are used and the light from the illumination source is collimated prior to passing through exposure slit 34, in various embodiments. Various configurations for directing light through slit 34 are used. Beam 32 passes through reduction projection lens 40 and reduces the size of an image formed on reticle 44 that is projected onto substrate 2. Reticle 44 includes exposure field 46, the entirety of which is projected onto substrate 2. The pattern in exposure field 46 is reduced in size on substrate 2 where it will be later converted to a masking pattern after the pattern is developed.

Exposure field 46 includes a single die in some embodiments and exposure field 46 includes a cell of multiple die in other embodiments. For brevity and clarity of description, the image of the exposure field will be referred to as a cell, hereinafter, though the "cell" may be one die in some embodiments. The arrows indicate the respective directions along which substrate 2 and reticle 44 translate during exposure. Substrate 2 is on a stage (not shown) which is capable of translational motion using any of various mechanical means. Various mechanical features and arrangements are used to provide motion to reticle 44. In steps 1, 2 and 3 of FIG. 3, reticle 44 moves in the opposite direction of substrate 2. Steps 1, 2 and 3 involve the patterning of a first cell on substrate 2 and steps 4, 5 and 6 involve the patterning of a second adjacent cell on substrate 2 along the same linear scan.

Steps 1, 2, 3 represent the steps in which beam 32 scans through the entire exposure field 46 of reticle 44 to project the pattern onto first cell 50 of substrate 2. After step 3, the direction along which reticle 44 translates, is reversed. Steps 4, 5 and 6 represent the exposure of a cell 52 adjacent cell 50. Cell 52 is patterned by beam 32 passing through the entirety of exposure field 46 as reticle 44 is translated in the same direction as substrate 2. In summary, in steps 1, 2 and 3, substrate 2 and reticle 44 are translated in opposite directions and in steps 4, 5 and 6, substrate 2 and reticle 44 translate in the same direction. Therefore, the pattern produced in cell 52 will be the inverse of the pattern of cell 50 even though formed from the same reticle 44. This is as indicated in FIGS. 1 and 2 which show that the pattern projected onto adjacent die along the scan direction are inverted. This direction of reticle 44 is reversed for each subsequent cell along the scan direction. As such, as the scan continues along the scan direction, each cell includes a pattern that is the inverse of the cell adjacent to it. Alternatively stated, as substrate 2 is scanned along one direction relative to the fixed beam 32, reticle 44 is alternatingly translated along opposite directions for each successive exposure field 46 projected as a cell (50, 52) onto substrate 2.

After the exposure pattern is formed as described, a develop operation is used to develop either the exposed or unexposed photoresist to form a photomask. The patterned photomask is utilized in subsequent processing operations such as etching, ion implantation, or various other operations.

According to one aspect, the disclosure provides a method for patterning a substrate. The method comprises providing a substrate that is divided into a plurality of die arranged in columns and rows, and providing an illumination source, a reticle and a projection lens. The method also provides for patterning the substrate with a pattern from the reticle by projecting a beam from the illumination source through the reticle and the projection lens and onto the substrate by scanning by carrying out a plurality of scans, each scan comprising continuously translating the substrate relative to the beam in a continuous linear scan along a complete one of the columns in a scan direction.

According to another aspect, the disclosure provides a method for patterning a substrate. The method comprises providing a substrate that is substantially round in shape; and providing an illumination source, a reticle and a projection lens. The method also provides for repeatedly projecting a pattern from the reticle onto the substrate by projecting a beam from the illumination source through the reticle and the projection lens, onto the substrate starting at a first location at or adjacent an edge of the substrate and scanning, by continuously linearly translating the substrate relative to the beam along a scan direction until the beam arrives at a second location at or adjacent the edge.

Also provided is another method for patterning a substrate. The method comprises providing a substrate that is substantially round in shape and includes a plurality of cells arranged in rows and columns; providing a system including an illumination source, a reticle and a projection lens, the reticle including a cell pattern with a plurality of die. The method also provides for patterning the substrate by repeatedly projecting the cell pattern onto the substrate by projecting a beam from the illumination source through the reticle and the projection lens and onto the substrate starting at a first cell being an uppermost or lowermost cell in a first column of the columns, and scanning by using a plurality of scans, each scan including translating the reticle relative to the beam, and translating the substrate relative to the beam in a scan direction in a continuous linear scan along the entirety of the first column.

The preceding merely illustrates the principles of the disclosure. It will thus be appreciated that one of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by one of ordinary skill in the art without departing from the scope and range of equivalents of the disclosure.

What is claimed is:

1. A method for patterning a substrate, said method comprising:

providing a substrate that is divided into a plurality of die arranged in columns and rows;

providing an illumination source, a reticle and a projection lens;

patterning said substrate with a pattern from said reticle by projecting a beam from said illumination source through said reticle and said projection lens and onto said substrate by scanning by carrying out a plurality of scans, each said scan comprising continuously translating said substrate relative to said beam in a continuous linear scan along a complete one of said columns in a scan direction, wherein said patterning a substrate includes forming said beam by directing light from said illumination source through an exposure slit and translating said reticle relative to said beam during said scanning, said translating said reticle including translating said reticle along said scan direction to form a first die of said plurality of die and translating said reticle along a direction opposite said scan direction to form an adjacent second die of said plurality of die along a first column of said columns of said scan direction.

2. The method as in claim 1, wherein said pattern comprises a cell including a plurality of said die, and wherein each said scan includes repeatedly projecting said cell onto said substrate along said scan direction.

3. The method as in claim 1, wherein said substrate is a semiconductor wafer that is substantially round in shape.

4. The method as in claim 1, wherein said carrying out a plurality of scans includes carrying out a first scan in said scan direction along a first column and carrying out a second scan along an opposite direction in an adjacent second column.

5. The method as in claim 4, wherein each of said plurality of scans is carried out at a substantially constant scan speed, and further comprising stepping by moving said substrate in a direction substantially orthogonal to said scan direction between said first scan and said second scan.

6. A method for patterning a substrate, said method comprising:

providing a substrate that is substantially round in shape;

providing an illumination source, a reticle and a projection lens; and repeatedly projecting a pattern from said reticle onto said substrate by projecting a beam from said illumination source through said reticle and said projection lens, onto said substrate starting at a first location at or adjacent an edge of said substrate and scanning, by continuously linearly translating said substrate relative to said beam along a scan direction until said beam arrives at a second location at or adjacent said edge, wherein said projecting a beam includes forming said beam by directing light from said illumination source through an exposure slit, and wherein said repeatedly projecting a pattern includes translating said reticle along said scan direction during said scanning to form a first cell along said scan direction and translating said reticle along a direction opposite said scan direction to form an adjacent second cell along said scan direction.

7. The method as in claim 6, wherein said scanning includes using a substantially constant scan speed.

8. The method as in claim 7, wherein said repeatedly projecting a pattern comprises projecting a die pattern from said reticle onto each of a plurality of individual die along said scan direction during said scanning.

9. The method as in claim 6, further comprising stepping by moving said substrate in a direction substantially orthogonal to said scan direction after said beam arrives at said second location, then
further repeatedly projecting said pattern from said reticle through said projection lens and onto said substrate by further scanning by continuously linearly translating said substrate relative to said beam in a direction parallel to and opposite said scan direction until said beam arrives at a third location at or adjacent said edge.

10. The method as in claim 6, wherein said reticle includes said cell pattern and said cell pattern includes a plurality of die.

11. A method for patterning a substrate, said method comprising:
providing a substrate that includes a plurality of cells arranged in rows and columns;
providing a system including an illumination source, a reticle and a projection lens, said reticle including a cell pattern with a plurality of die; and
patterning said substrate by repeatedly projecting said cell pattern onto said substrate by projecting a beam from said illumination source through said reticle and said projection lens and onto said substrate starting at a first cell being an uppermost or lowermost cell in a first column of said columns, and scanning by using a plurality of scans, each said scan including translating said reticle relative to said beam, and translating said substrate relative to said beam in a scan direction in a continuous linear scan along the entirety of said first column,
wherein said projecting a beam includes forming said beam by directing light from said illumination source through an exposure slit,
wherein said translating said reticle relative to said beam takes place during said translating said substrate and includes translating said reticle along said scan direction for a first cell and translating said reticle along a direction opposite said scan direction for an adjacent second cell along said continuous linear scan.

12. The method as in claim 11, wherein said substrate is substantially round in shape and plurality of scans includes a first scan along said first column in a first scan direction and a second scan along an adjacent column in a second scan direction being parallel and opposite said first scan direction, and further comprising stepping by moving said substrate in a direction substantially orthogonal to said first direction between said first scan and said second scan.

13. The method as in claim 11, wherein each scan includes translating said substrate relative to said beam at a substantially constant scan speed, said substrate comprises a semiconductor wafer, and each said cell includes an array of die of integrated circuits.

* * * * *